US012712537B2

(12) United States Patent
Kim et al.

(10) Patent No.: US 12,712,537 B2
(45) Date of Patent: Aug. 18, 2026

(54) FREQUENCY CONTROL CIRCUIT AND FREQUENCY CONTROL METHOD

(71) Applicant: LX SEMICON CO., LTD., Daejeon (KR)

(72) Inventors: Kyu Ho Kim, Daejeon (KR); Jin Ho Choi, Daejeon (KR)

(73) Assignee: LX SEMICON CO., LTD., Daejeon (KR)

(*) Notice: Subject to any disclaimer, the term of this patent is extended or adjusted under 35 U.S.C. 154(b) by 0 days.

(21) Appl. No.: 18/723,627

(22) PCT Filed: Dec. 23, 2022

(86) PCT No.: PCT/KR2022/021141

§ 371 (c)(1),
(2) Date: Jun. 24, 2024

(87) PCT Pub. No.: WO2023/121374

PCT Pub. Date: Jun. 29, 2023

(65) Prior Publication Data

US 2025/0088181 A1 Mar. 13, 2025

(30) Foreign Application Priority Data

Dec. 24, 2021 (KR) ........................ 10-2021-0187226
Dec. 22, 2022 (KR) ........................ 10-2022-0181813

(51) Int. Cl.
*H03K 5/00* (2006.01)

(52) U.S. Cl.
CPC ................................ *H03K 5/00006* (2013.01)

(58) Field of Classification Search
CPC ... H03K 5/00006; H03K 3/011; H03K 5/1534
See application file for complete search history.

(56) References Cited

U.S. PATENT DOCUMENTS 4,587,496 A * 5/1986 Wolaver .................. H03L 7/113 331/11
5,247,215 A * 9/1993 Atriss ........................ H03L 7/08 327/40
6,642,747 B1 * 11/2003 Chiu ....................... H03L 7/087 327/40
6,834,093 B1 * 12/2004 Chiu .................... G01R 23/005 327/43

(Continued)

FOREIGN PATENT DOCUMENTS

KR 10-2007-0003284 A 1/2007
KR 10-2008-0055253 A 6/2008

(Continued)

OTHER PUBLICATIONS

International Search Report issued for International Application No. PCT/KR2022/021141 on Apr. 5, 2023, 6 pages.

*Primary Examiner* — Tuan T Lam
(74) *Attorney, Agent, or Firm* — ROTHWELL, FIGG, ERNST & MANBECK, P.C.

(57) ABSTRACT

Disclosed in an embodiment is a frequency control circuit. The frequency control circuit is able to compare a preset target frequency value with an output frequency value of an output signal and control the frequency of the output signal according to a comparison result.

17 Claims, 3 Drawing Sheets

(56) References Cited

U.S. PATENT DOCUMENTS

2005/0057290 A1* 3/2005 Dalton ................. H03D 13/003 327/156
2010/0134192 A1* 6/2010 Min ........................ H03L 7/181 331/34
2011/0130103 A1* 6/2011 Michiyoshi ............. H03L 7/093 455/127.1
2013/0082784 A1* 4/2013 Chiu ....................... H03L 7/091 331/44
2018/0083637 A1* 3/2018 Wang ...................... H03L 7/099
2021/0075431 A1* 3/2021 Wei ......................... H03L 7/091

FOREIGN PATENT DOCUMENTS

KR 10-2016-0006501 A 1/2016
KR 10-1725693 B1 4/2017
KR 10-2021-0151449 A 12/2021

* cited by examiner

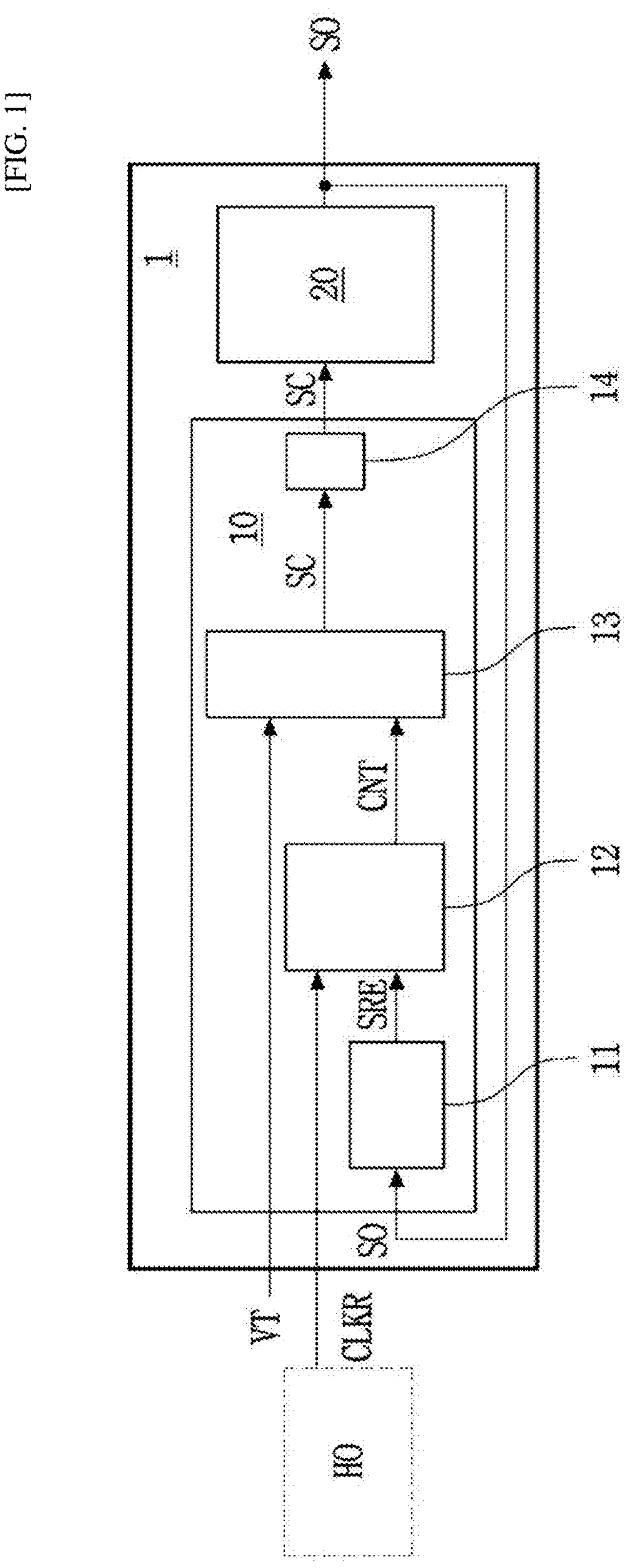
[FIG. 1]
SO
1
20
14
SC
10
SC
13
CNT
12
SRE
11
SO
VT
CLKR
HO

[FIG. 2]
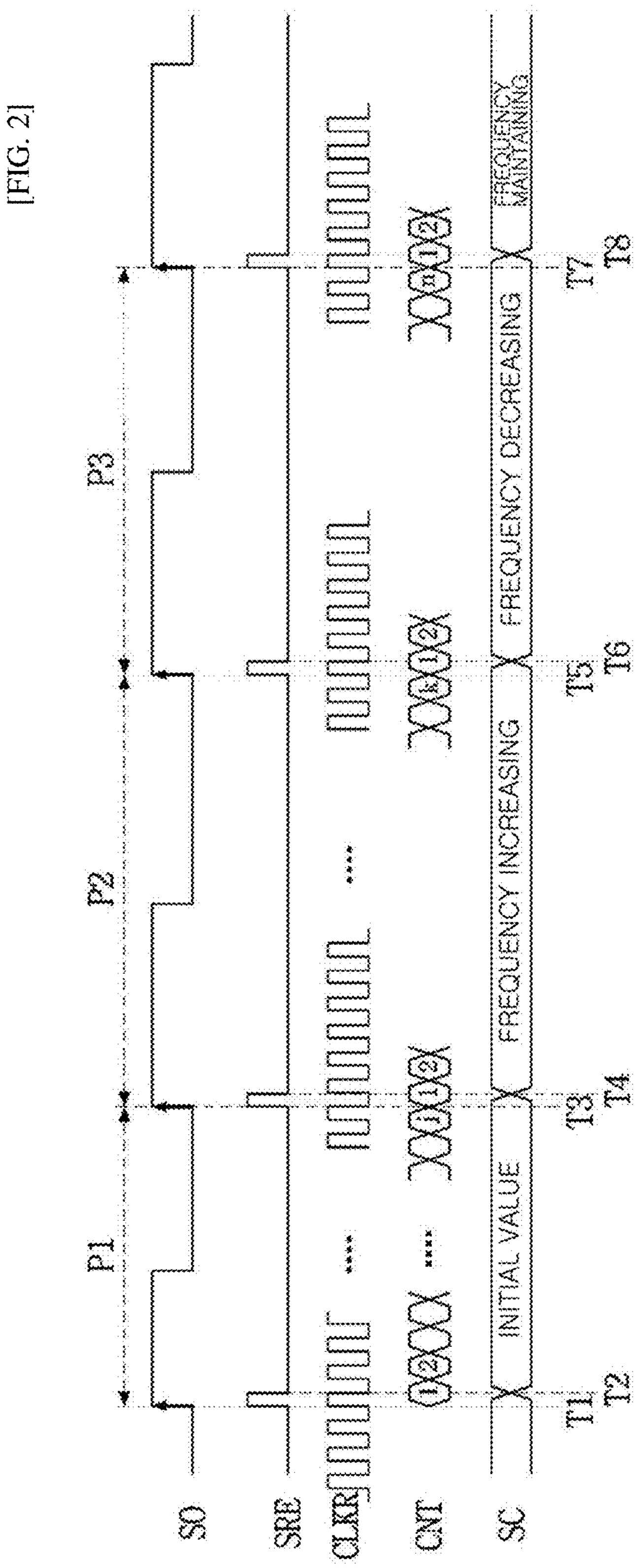

[FIG. 3]
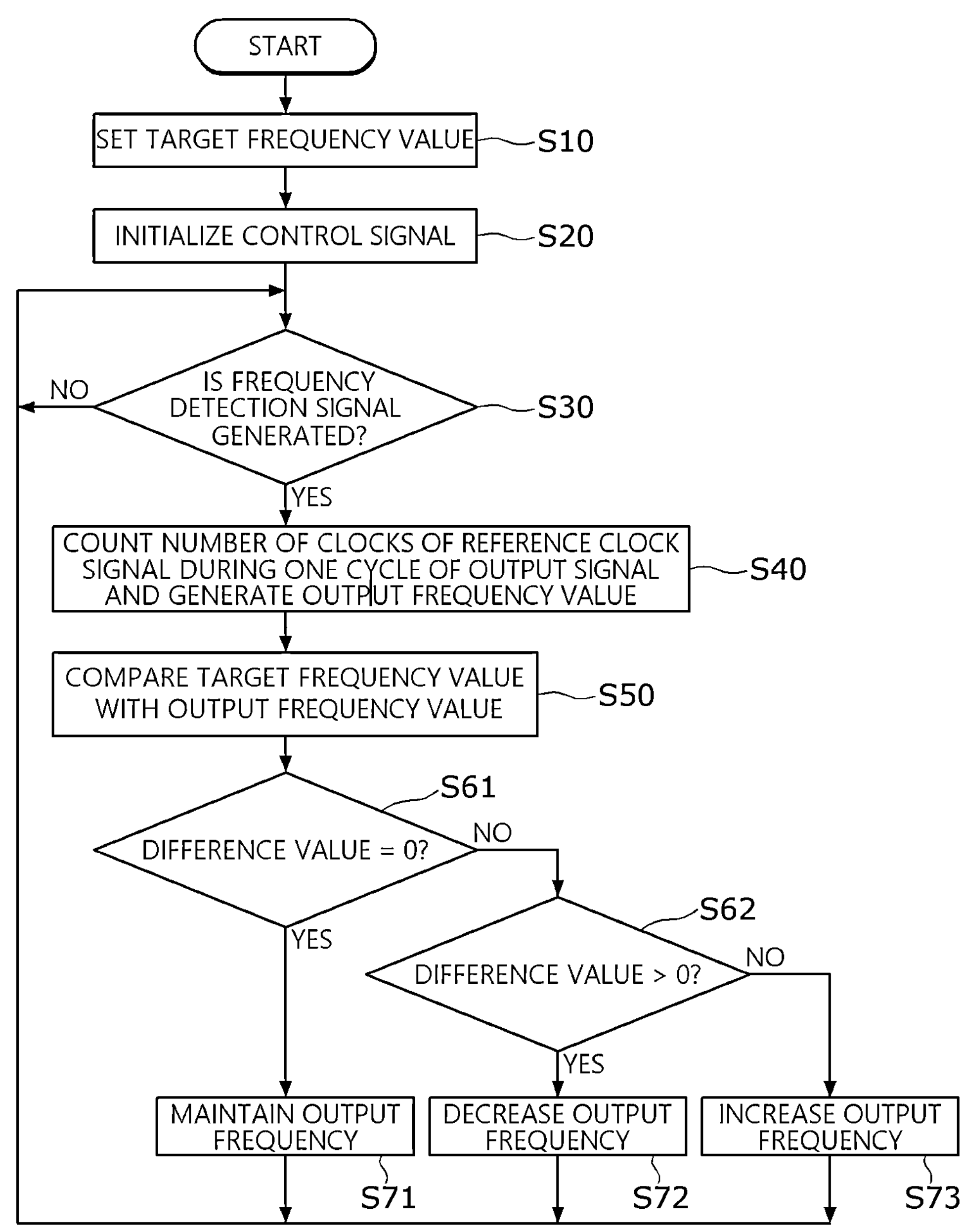

FREQUENCY CONTROL CIRCUIT AND FREQUENCY CONTROL METHOD

CROSS-REFERENCE TO RELATED APPLICATION(S)

This application is a 35 U.S.C. § 371 National Phase Entry application from PCT/KR2022/021141, filed on Dec. 23, 2022, which claims the benefits of Korean Patent Application No. 10-2021-0187226, filed on Dec. 24, 2021, and Korean Patent Application No. 10-2022-0181813, filed Dec. 22, 2022, all of the disclosures of which are herein incorporated by reference in their entirety.

TECHNICAL FIELD

The present invention relates to a technology for controlling a frequency of an output signal, and more specifically, to a frequency control circuit for controlling a frequency of an output signal and a method of controlling a frequency.

BACKGROUND ART

In general, an oscillator is one core component widely used in electrical and electronic fields and may be used to generate output signals having a clock.

An oscillator is used in various systems because of a simple configuration circuit so that an ultra-low power circuit configuration can be implemented in a small area.

In the case of a system on chip, an oscillator for a high frequency band and an oscillator for providing a real-time clock in a low frequency band may be used.

As an example, a real-time clock may be used in a watch-dog timer for independent operation or used to measure time using low power when a system enters a power down mode.

A real-time clock has a characteristic that a frequency changes according to changes in temperature or power voltage of an integrated circuit.

In order to solve such a problem, an oscillator for a real-time clock is designed to output a clock with an accurate frequency using a crystal or designed to be insensitive to a change in a surrounding environment. However, these conventional oscillators have a problem of increasing the size and current thereof.

In addition, the conventional oscillator controls a frequency through trimming to output a real-time clock with an accurate frequency regardless of a change in temperature or power voltage. However, there are problems that a long time is required for trimming and the manufacturing cost of an oscillator increases.

Technical Problem

Embodiments are intended to overcome the problems described above, the present invention is directed to providing a frequency control circuit capable of maintaining a constant frequency of an output signal regardless of changes in external environments such as changes in temperature and power voltage, and a method of controlling a frequency.

The embodiments are also directed to providing a frequency control circuit, which is capable of maintaining a constant frequency regardless of changes in external environments such as changes in outside and power voltage, uses a small current, and has a small size, and a method of controlling a frequency.

The embodiments are also directed to providing a frequency control circuit which is capable of maintaining a constant frequency regardless of changes in a surrounding environment without trimming a frequency and of which a manufacturing cost is reduced, and a method of controlling a frequency.

Technical objectives to be achieved from the present invention are not limited to the above-described objectives, and other unmentioned objectives may be clearly understood by those skilled in the art from the following descriptions.

Technical Solution

One aspect of the present invention provides a frequency control circuit including an output signal generation circuit which generates an output signal having a frequency according to a control signal and a frequency correction circuit which compares a preset target frequency value with an output frequency value corresponding to the output signal and generates the control signal for controlling the frequency of the output signal according to a comparison result.

In addition, another aspect of the present invention provides a method of controlling a frequency, the method including receiving a preset target frequency value, generating a frequency detection signal corresponding to a cycle of an output signal, generating an output frequency value corresponding to the number of clocks of a reference clock signal included in one cycle of the output signal using the frequency detection signal, comparing the target frequency value with the output frequency value, generating a control signal for controlling a frequency of the output signal according to a comparison result, and generating the output signal having a frequency controlled according to the control signal.

Advantageous Effects

A frequency control circuit and a method of controlling a frequency according to an embodiment have an effect of maintaining a constant frequency of an output signal regardless of changes in an external environment such as temperature.

Further, an embodiment has an effect of using a small size and a small amount of current while maintaining a constant frequency regardless of changes in an external environment.

Further, an embodiment has an effect of reducing manufacturing costs while maintaining a constant frequency regardless of changes in the surrounding environment without frequency trimming.

BRIEF DESCRIPTION OF DRAWINGS

FIG. 1 is a block diagram illustrating a configuration of a frequency control circuit according to an embodiment.

FIG. 2 shows operation timings of the frequency control circuit according to the embodiment.

FIG. 3 is a flowchart illustrating a method of controlling a frequency according to the embodiment.

MODES OF THE INVENTION

FIG. 1 is a block diagram illustrating a configuration of a frequency control circuit 1 according to an embodiment.

Referring to FIG. 1, the frequency control circuit 1 according to the embodiment may receive a reference clock signal CLKR from an external high frequency oscillator HO.

The high frequency oscillator HO may be formed to provide the reference clock signal CLKR having a frequency of 10 MHz or more, but the embodiment is not limited thereto. As an example, the frequency control circuit 1 may be set to operate in a low power mode and may not receive the reference clock signal CLKR with a high frequency requiring a large amount of power consumption in the low power mode. To this end, the high frequency oscillator HO may be turned off in the low power mode of the frequency control circuit 1 and may not provide the reference clock signal CLKR to the frequency control circuit 1.

In the frequency control circuit 1, a target frequency value VT may be set. The target frequency value VT may be understood as a digital value or a voltage level provided from the outside of the frequency control circuit 1 to maintain a constant frequency of an output signal SO.

The frequency control circuit 1 may generate an output frequency value CNT by counting the reference clock signal CLKR and generate the output signal SO using the output frequency value CNT and the preset target frequency value VT.

For example, the frequency control circuit 1 may generate a frequency detection signal SRE corresponding to a cycle of the output signal SO. More specifically, the frequency control circuit 1 may be formed to generate pulses corresponding to rising edges of the output signal SO and provide pulses representing the cycle of the output signal SO as the frequency detection signal SRE. In addition, the frequency control circuit 1 may receive the reference clock signal CLKR with a higher frequency than the output signal SO. The frequency control circuit 1 may count the number of clocks of the reference clock signal CLKR included one cycle of the output signal SO using the frequency detection signal SRE and generate the output frequency value CNT corresponding to the number of clocks of the reference clock signal CLKR included in one cycle of the output signal SO. The frequency control circuit 1 may compare the output frequency value CNT with the target frequency value VT. The frequency control circuit 1 may control a frequency of the output signal SO according to a comparison result of the output frequency value CNT and the target frequency value VT.

To this end, the frequency control circuit 1 may include a frequency correction circuit 10 and an output signal generation circuit 20.

The output signal generation circuit 20 generates the output signal SO having a frequency according to a control signal SC. In this case, an example of the output signal generation circuit 20 generates a real-time clock having a frequency of about 32 KHz as the output signal SO.

When the output signal SO and the reference clock signal CLKR are compared, the reference clock signal CLKR may be understood as a high frequency signal having a higher frequency than the output signal SO, and the output signal SO may be understood as a low frequency signal which may be counted through the reference clock signal CLKR.

The frequency correction circuit 10 may generate the control signal SC using the output signal SO. Specifically, the frequency correction circuit 10 may detect rising edges of the output signal SO. The frequency correction circuit 10 may be synchronized with the rising edges of the output signal SO and may count the reference clock signal CKLR. The frequency correction circuit 10 may generate the number of clocks of the reference clock signal CKLR corresponding to one cycle of the output signal SO, that is, the output frequency value CNT. The frequency correction circuit 10 may compare the output frequency value CNT with the preset target frequency value VT.

The target frequency value VT may be set to the output frequency value CNT when a frequency of the output signal SO is a reference frequency. As an example, the reference frequency may be set to 32.7658 kHz, and the target frequency value VT may be provided as a value corresponding to 32.7658 kHz, but the embodiment is not limited thereto.

As a result of comparing the output frequency value CNT with the target frequency value VT, when the output frequency value CNT and the target frequency value VT are the same, the frequency correction circuit 10 may generate the control signal SC to maintain a current frequency of the output signal SO.

As the result of comparing the output frequency value CNT with the target frequency value VT, when the target frequency value VT is greater than the output frequency value CNT, the frequency correction circuit 10 may generate the control signal SC to increase the frequency of the output signal SO.

As the result of comparing the output frequency value CNT with the target frequency value VT, when the target frequency value VT is smaller than the output frequency value CNT, the frequency correction circuit 10 may generate the control signal SC to decrease the frequency of the output signal SO.

The frequency correction circuit 10 may include a frequency detector 11, an output frequency value provider 12, a comparator 13, and a latch 14.

The frequency detector 11 may be formed to generate the frequency detection signal SRE corresponding to the cycle of the output signal SO.

More specifically, the frequency detector 11 may receive the output signal SO. The frequency detector 11 may be formed to generate pulses corresponding to the rising edges of the output signal SO and provide pulses representing the cycle of the output signal SO as the frequency detection signal SRE.

The frequency detector 11 may be synchronized at a time point at which the output signal SO is transitioned from a low level to a high level, that is, at a rising edge time point of the output signal SO, and may generate pulses for providing as the frequency detection signal SRE. Accordingly, the pulses provided as the frequency detection signal SRE may be understood to represent the cycle of the output signal SO.

For example, the frequency detector 11 may provide pulses corresponding to a first rising edge and a next rising edge of the output signal SO and determine a time between a rising time of the pulse corresponding to the first rising edge of the output signal SO and a rising time of the pulse corresponding to the next rising edge as the cycle of the output signal SO.

The output frequency value provider 12 may be formed to receive the reference clock signal CLKR with the higher frequency than the output signal SO and the frequency detection signal SRE of the frequency detector 11.

The output frequency value provider 12 may be formed to output the output frequency value CNT corresponding to the number of clocks of the reference clock signal CLKR included in one cycle of the output signal SO using the frequency detection signal SRE.

To this end, the output frequency value provider 12 may use a clock counter, and the clock counter may be formed to set the output frequency value CNT to a preset initial value using the frequency detection signal SRE and output the output frequency value CNT corresponding to a result of counting the number of clocks of the reference clock signal CLKR during one cycle of the output signal SO. In this case, the initial value may be variously set according to an intention of a manufacturer.

The reference clock signal CLKR has a higher frequency than the output signal SO. Accordingly, one cycle of the output signal SO may include a plurality of clocks of the reference clock signal CLKR.

One cycle of the output signal SO may correspond to one cycle of the frequency detection signal SRE, and the output frequency value provider 12 may be understood to count the number of the clocks of the reference clock signal CLKR included in one cycle of the output signal SO.

For example, the output frequency value provider 12 may be synchronized with the frequency detection signal SRE, cumulatively count the clocks of the reference clock signal CLKR included in one cycle of the output signal SO, and generate a result of the counting as the output frequency value CNT. The output frequency value provider 12 may be synchronized with the frequency detection signal SRE, transmit the output frequency value CNT having the result of the counting in the current cycle to the comparator 13, and initialize the output frequency value CNT.

The comparator 13 may receive the preset target frequency value VT from the outside of the frequency control circuit 1. In addition, the comparator 13 may receive the output frequency value CNT from the output frequency value provider 12.

The comparator 13 may be configured to compare the target frequency value VT with the output frequency value CNT and output the control signal SC corresponding to a comparison result.

For the above-described determination, the comparator 13 may calculate a difference value between the target frequency value VT and the output frequency value CNT. In this case, the difference value between the target frequency value VT and the output frequency value CNT may be defined as a value of the output frequency value CNT minus the target frequency value VT.

The comparator 13 may generate the control signal SC to control the frequency of the output signal SO according to the difference value between the target frequency value VT and the output frequency value CNT.

For example, when the output frequency value CNT is the same as the target frequency value VT, that is, when the difference value between the target frequency value VT and the output frequency value CNT is zero, the comparator 13 may determine that the current frequency of the output signal SO corresponds to the target frequency value VT. In this case, the comparator 13 may generate the control signal SC for maintaining the current frequency of the output signal SO of the output signal generation circuit 20.

When the output frequency value CNT is greater than the target frequency value VT, that is, when the difference value between the target frequency value VT and the output frequency value CNT is greater than zero, the comparator 13 may determine that the current frequency of the output signal SO is higher than the target value. In this case, the comparator 13 may generate the control signal SC for decreasing the frequency of the output signal SO of the output signal generation circuit 20. That is, the comparator 13 may generate the control signal SC to decrease the frequency of the output signal SO such that the frequency of the output signal SO reaches the target value.

When the output frequency value CNT is smaller than the target frequency value VT, that is, when the difference value between the target frequency value VT and the output frequency value CNT is less than zero, the comparator 13 may determine that the current frequency of the output signal SO is lower than the target value. In this case, the comparator 13 may generate the control signal SC for increasing the frequency of the output signal SO of the output signal generation circuit 20. That is, the comparator 13 may generate the control signal SC to increase the frequency of the output signal SO such that the frequency of the output signal SO reaches the target value.

The latch 14 may latch the control signal SC generated by the comparator 13. The latch 14 may be formed to latch the control signal SC during one cycle of the output signal SO. That is, the control signal SC may be provided to the output signal generation circuit 20 through the latch 14.

In addition, when the high frequency oscillator HO is turned off in the low power mode, the latch 14 may maintain the latch state of the control signal SC. As an example, in the low power mode, an operation of the comparator 13 may be inactivated by a preset mode determination signal (not shown), and as a result, the latch 14 may maintain the finally latched control signal SC.

The output signal generation circuit 20 may generate the output signal SO with a frequency corresponding to the control signal SC. The output signal generation circuit 20 may be a clock oscillator which generates a clock signal in real time, but the embodiment is not limited thereto.

The frequency correction circuit 10 provided as in FIG. 1 may control the frequency of the output signal SO and, when the frequency correction circuit 10 enters the preset low power mode, control to maintain the frequency of the output signal SO by maintaining the control signal SC at a previous level.

Hereinafter, an operation of the frequency control circuit 1 according to the embodiment will be described with reference to FIG. 2.

FIG. 2 shows operation timings of the frequency control circuit according to the embodiment.

At a time point T1, the frequency detector 11 may detect a first rising edge of an output signal SO. The frequency detector 11 may generate a pulse for providing as a frequency detection signal SRE at the time point T1, that is, a first rising edge time point of the output signal SO. That is, the frequency detection signal SRE may be generated at the first rising edge time point of the output signal SO. A time between the time point T1 corresponding to the first rising edge of the output signal SO and a time point T3 corresponding to a second rising edge of the output signal SO may be understood as a first cycle P1 of the output signal SO. A pulse width of the frequency detection signal SRE may be set by the manufacturer, and in this case, a falling edge of the frequency detection signal SRE may be defined as a time point T2.

The output frequency value provider 12 may be set to have an initial value using the frequency detection signal SRE at the time point T1.

The output frequency value provider 12 may cumulatively count clocks of a reference clock signal CLKR from the time point T1 to the time point T3 of the first cycle P1 and generate an output frequency value CNT corresponding to a count result. For example, the output frequency value provider 12 may count the clocks of the reference clock signal CLKR increased in one increment to a value j from the time point T1 to the time point T3 and generate the value j as a first output frequency value.

The comparator 13 may compare a target frequency value VT with the first output frequency value j in the first cycle P1. The comparator 13 may compare the target frequency value VT with the first output frequency value j to determine a frequency of the output signal SO in the first cycle P1. To this end, the comparator 13 may calculate a first difference value between the target frequency value VT and the first output frequency value j. The first difference value may be obtained through a calculation of subtracting the target frequency value VT from the first output frequency value j. The comparator 13 may generate a control signal SC for controlling the frequency of the output signal SO to become the target value according to the first difference value between the target frequency value VT and the first output frequency value j.

For example, in the first cycle P1, when a target frequency value VT is greater than a first output frequency value j, that is, when a first difference value between the target frequency value VT and the first output frequency value j is less than zero, the comparator 13 may determine that a frequency of an output signal SO in the first cycle P1 is lower than a target value. The comparator 13 may generate a control signal SC to increase the frequency of the output signal SO of the output signal generation circuit 20. That is, the comparator 13 may generate the control signal SC such that the frequency of the output signal SO reaches the target value. Accordingly, the frequency of the output signal SO in a second cycle P2 may be increased as compared to the frequency of the output signal SO in the first cycle P1.

Then, at the time point T3, the frequency detector 11 may detect the second rising edge of the output signal SO. The frequency detector 11 may generate a pulse for providing as a frequency detection signal SRE at the time point T3, that is, a second rising edge time point of the output signal SO. That is, the frequency detection signal SRE may be generated at the second rising edge time point of the output signal SO. A time from the time point T3 corresponding to the second rising edge of the output signal SO to a time point T5 corresponding to a third rising edge of the output signal SO may be understood as a second cycle P2 of the output signal SO. In this case, a falling edge of the frequency detection signal SRE may be defined as a time point T4.

The output frequency value provider 12 may be set to have an initial value using the frequency detection signal SRE at the time point T3.

The output frequency value provider 12 may cumulatively count clocks of the reference clock signal CLKR from the time point T3 to the time point T5 of the second cycle P2 and generate an output frequency value CNT corresponding to a count result. For example, the output frequency value provider 12 may count the clocks of the reference clock signal CLKR increased in one increment to a value k from the time point T3 to the time point T5 and generate the value k as a second output frequency value k.

The comparator 13 may compare a target frequency value VT with the second output frequency value k in the second cycle P2. The comparator 13 may compare the target frequency value VT with the second output frequency value k to determine a frequency of the output signal SO in the second cycle P2. To this end, the comparator 13 may calculate a second difference value between the target frequency value VT and the second output frequency value k. The second difference value may be obtained through a calculation of subtracting the target frequency value VT from the second output frequency value j. The comparator 13 may generate a control signal SC for controlling the frequency of the output signal SO to become the target value according to the second difference value between the second output frequency value k and the target frequency value VT.

For example, in a second cycle P2, when a target frequency value VT is smaller than a second output frequency value k, that is, when a second difference value between the target frequency value VT and the second output frequency value k is greater than zero, the comparator 13 may determine that a frequency of the output signal SO in the second cycle P2 is higher than a target value. The comparator 13 may generate a control signal SC to decrease the frequency of the output signal SO of the output signal generation circuit 20. That is, the comparator 13 may generate the control signal SC such that the frequency of the output signal SO reaches the target value. Accordingly, the frequency of the output signal SO in a third cycle P3 may be decreased as compared to the frequency of the output signal SO in the second cycle P2.

Then, at the time point T5, the frequency detector 11 may detect the third rising edge of the output signal SO. The frequency detector 11 may generate a pulse for providing as a frequency detection signal SRE at the time point T5, that is, a third rising edge time point of the output signal SO. That is, the frequency detection signal SRE may be generated at the third rising edge time point of the output signal SO. A time from a time point T5 corresponding to the third rising edge of the output signal SO to a time point T7 corresponding to a fourth rising edge of the output signal SO may be understood as a third cycle P3 of the output signal SO. In this case, a falling edge of the frequency detection signal SRE may be defined as a time point T6.

The output frequency value provider 12 may be set to have an initial value using the frequency detection signal SRE at the time point T5.

The output frequency value provider 12 may cumulatively count clocks of the reference clock signal CLKR from the time point T5 to the time point T7 of the third cycle P3 and generate an output frequency value CNT corresponding to a count result. For example, the output frequency value provider 12 may count the clocks of the reference clock signal CLKR increased in one increment to a value n from the time point T5 to the time point T7 and generate the value n as a third output frequency value.

The comparator 13 may compare a target frequency value VT with the third output frequency value n in the third cycle P3. The comparator 13 may compare the target frequency value VT with the third output frequency value n to determine a frequency of the output signal SO in the third cycle P3. To this end, the comparator 13 may calculate a third difference value between the target frequency value VT and the third output frequency value n. The value n is a value corresponding to the target frequency value VT of the reference clock signal CLKR.

The comparator 13 may determine that the target frequency value VT is the same as the third output frequency value.

For example, in a third cycle P3, when a third output frequency value n and a target frequency value VT are the same, that is, when a difference value between the target frequency value VT and the third output frequency value n is zero, the comparator 13 may determine that a frequency of the output signal SO corresponds to a target value in the third cycle P3. Accordingly, the comparator 13 may generate a control signal SC to maintain a current frequency of the output signal SO of the output signal generation circuit 20. Accordingly, in a cycle after the third cycle P3, a frequency of an output signal SO may be maintained to be the same as that of in the third cycle.

Hereinafter, a method of controlling a frequency according to the embodiment will be described with reference to FIG. 3

FIG. 3 is a flowchart illustrating a method of controlling a frequency according to the embodiment.

In operation S10, the frequency control circuit 1 may receive a preset target frequency value VT from the outside and set the target frequency value VT. The target frequency value VT may be generated according to an input from the outside or preset as an internally stored value but the embodiment is not limited thereto.

In operation S20, the frequency control circuit 1 may initialize a control signal SC.

In operation S30, the frequency control circuit 1 may generate pulses synchronizing with rising edges of an output signal SO, that is, a frequency detection signal SRE.

In operation S40, the frequency control circuit 1 may count the number of clocks of a reference clock signal CLKR in one cycle of the output signal SO using the frequency detection signal SRE. In addition, the frequency control circuit 1 may generate an output frequency value CNT corresponding to the number of pulses counted in one cycle of the frequency detection signal SRE, that is, one cycle of the output signal SO.

In operation S50, the frequency control circuit 1 may compare the target frequency value VT with the output frequency value CNT. The frequency control circuit 1 may compare the target frequency value VT with the output frequency value CNT to determine a current frequency of the output signal SO. In addition, the frequency control circuit 1 may calculate a difference value between the target frequency value VT and the output frequency value CNT.

In operation S61, the frequency control circuit 1 may determine whether the output frequency value CNT is the same as the target frequency value VT. That is, the frequency control circuit 1 may determine whether the difference value between the target frequency value VT and the output frequency value CNT is zero.

In operation S62, the frequency control circuit 1 may determine whether the output frequency value CNT is greater than the target frequency value VT. That is, the frequency control circuit 1 may determine whether the difference value between the target frequency value VT and the output frequency value CNT is greater than zero.

In operation S71, when the output frequency value CNT is the same as the target frequency value VT, that is, when the difference value between the target frequency value VT and the output frequency value CNT is zero, the frequency control circuit 1 may determine that the current frequency of the output signal SO is a frequency corresponding to the target value. In this case, the frequency control circuit 1 may generate a control signal SC to maintain the frequency of the output signal SO of the output signal generation circuit 20. That is, the frequency control circuit 1 may generate the control signal SC so that the frequency of the output signal SO maintains the target value.

In operation S72, when the target frequency value VT is smaller than the output frequency value CNT, that is, when the difference value between the target frequency value VT and the output frequency value CNT is greater than zero, the frequency control circuit 1 may determine that the current frequency of the output signal SO is higher than the target value. The frequency control circuit 1 may generate a control signal SC to decrease the frequency of the output signal SO of the output signal generation circuit 20. That is, the frequency control circuit 1 may generate the control signal SC so that the frequency of the output signal SO reaches the target value.

In operation S73, when the target frequency value VT is greater than the output frequency value CNT, that is, when the difference value between the target frequency value VT and the output frequency value CNT is less than zero, the frequency control circuit 1 may determine that the current frequency of the output signal SO is lower than the target value. The frequency control circuit 1 may generate a control signal SC for increasing the frequency of the output signal SO of the output signal generation circuit 20. That is, the frequency control circuit 1 may generate the control signal SC so that the frequency of the output signal SO reaches the target value.

As described above, the present invention can maintain a constant frequency of an output signal regardless of changes in an external environment such as changes in temperature or power voltage.

Accordingly, the present invention can maintain a constant frequency regardless of changes in an external environment such as changes in temperature or power voltage without increasing a size of an oscillator, increasing an amount of a current, or requiring time for trimming.

Accordingly, the present invention has an advantage of implementing a frequency control circuit which has a small size, can use a small amount of current, and can be manufactured with a low cost.

The invention claimed is:

1. A frequency control circuit comprising:

an output signal generation circuit configured to generate an output signal having a frequency according to a control signal; and a frequency correction circuit configured to;

receive a preset target frequency value;

generate a frequency detection signal corresponding to a cycle of the output signal;

generate an output frequency value corresponding to the number of clocks of a reference clock signal included in one cycle of the output signal using the frequency detection signal;

compare the preset target frequency value with the output frequency value; and generate the control signal for controlling a frequency of the output signal according to a comparison result.

2. The frequency control circuit of claim 1, wherein the frequency correction circuit includes:

a frequency detector configured to generate the frequency detection signal corresponding to the cycle of the output signal; and an output frequency value provider configured to output the output frequency value corresponding to the cycle of the output signal using the frequency detection signal.

3. The frequency control circuit of claim 2, wherein the frequency detector is configured to:

generate pulses corresponding to rising edges of the output signal; and provide pulses representing the cycle of the output signal as the frequency detection signal.

4. The frequency control circuit of claim 2, wherein the output frequency value provider is configured to:

receive a reference clock signal with a higher frequency than the output signal; and output the output frequency value corresponding to the number of clocks of the reference clock signal included in the one cycle of the output signal using the frequency detection signal.

5. The frequency control circuit of claim 4, wherein:

the output frequency value provider is formed using a clock counter; and the clock counter is configured to set the output frequency value to a preset initial value using the frequency detection signal and output the output frequency value corresponding to a result of counting the number of the clocks of the reference clock signal during the one cycle of the output signal.

6. The frequency control circuit of claim 1, wherein the frequency correction circuit includes a comparator configured to output the control signal corresponding to the comparison result.

7. The frequency control circuit of claim 6, wherein the comparator is configured to:

output the control signal for increasing the frequency of the output signal when the preset target frequency value is greater than the output frequency value; and output the control signal for decreasing the frequency of the output signal when the preset target frequency value is less than the output frequency value.

8. The frequency control circuit of claim 6, wherein the comparator is configured to output the control signal for maintaining the frequency of the output signal when the preset target frequency value is the same as the output frequency value.

9. The frequency control circuit of claim 1, wherein the frequency correction circuit:

further includes a latch configured to latch the control signal; and is configured to provide the control signal to the output signal generation circuit through the latch.

10. The frequency control circuit of claim 1, wherein the frequency correction circuit is configured to maintain the control signal at a previous level when entering a preset low power mode.

11. A method of controlling a frequency comprising:

receiving a preset target frequency value;

generating a frequency detection signal corresponding to a cycle of an output signal;

generating an output frequency value corresponding to the number of clocks of a reference clock signal included in one cycle of the output signal using the frequency detection signal;

comparing the preset target frequency value with the output frequency value;

generating a control signal for controlling a frequency of the output signal according to a comparison result; and generating the output signal having a frequency controlled according to the control signal.

12. The method of claim 11, wherein the generating the frequency detection signal includes generating pulses corresponding to rising edges of the output signal and providing pulses representing the cycle of the output signal as the frequency detection signal.

13. The method of claim 11, wherein the generating of the output frequency value includes:

receiving a reference clock signal with a higher frequency than the output signal; and generating the output frequency value corresponding to the number of clocks of the reference clock signal included in the one cycle of the output signal using the frequency detection signal.

14. The method of claim 11, wherein the comparing the preset target frequency value with the output frequency value includes generating the control signal to increase the frequency of the output signal when the preset target frequency value is greater than the output frequency value as a comparison result.

15. The method of claim 11, wherein the comparing the preset target frequency value with the output frequency value includes generating the control signal to decrease the frequency of the output signal when the preset target frequency value is less than the output frequency value as a comparison result.

16. The method of claim 11, wherein the comparing the preset target frequency value with the output frequency value includes generating the control signal to maintain the frequency of the output signal when the preset target frequency value and the output frequency value are the same as a comparison result.

17. The method of claim 11, wherein, when a preset low power mode starts, the control signal is maintained at a previous level.

* * * * *